(12) United States Patent
Wang et al.

(10) Patent No.: US 9,571,097 B2
(45) Date of Patent: Feb. 14, 2017

(54) TOUCH SCREEN AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hongjuan Liu, Beijing (CN); Xiaoliang Ding, Beijing (CN); Lei Wang, Beijing (CN); Chunlei Wang, Beijing (CN); Shengji Yang, Beijing (CN); Yingming Liu, Beijing (CN); Weijie Zhao, Beijing (CN); Tao Ren, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 188 days.

(21) Appl. No.: 14/371,538

(22) PCT Filed: Dec. 25, 2013

(86) PCT No.: PCT/CN2013/090459
§ 371 (c)(1),
(2) Date: Jul. 10, 2014

(87) PCT Pub. No.: WO2014/183452
PCT Pub. Date: Nov. 20, 2014

(65) Prior Publication Data
US 2015/0060252 A1 Mar. 5, 2015

(30) Foreign Application Priority Data
May 17, 2013 (CN) .................... 2013 1 0183646.3

(51) Int. Cl.
*H03K 17/96* (2006.01)
*G06F 3/041* (2006.01)
*G06F 3/044* (2006.01)

(52) U.S. Cl.
CPC ........... *H03K 17/9622* (2013.01); *G06F 3/044* (2013.01); *G06F 3/0412* (2013.01); *H03K 2017/9613* (2013.01); *H03K 2217/960745* (2013.01); *H03K 2217/960755* (2013.01)

(58) Field of Classification Search
CPC .... G06F 3/0412; G06F 3/044; H03K 17/9622; H03K 2017/9613
See application file for complete search history.

(56) References Cited

U.S. PATENT DOCUMENTS

2009/0213090 A1* 8/2009 Mamba .................. G06F 3/044
345/174
2011/0157058 A1 6/2011 Bita et al.
(Continued)

FOREIGN PATENT DOCUMENTS

| CN | 102819347 A | 12/2012 |
| CN | 102955637 A | 3/2013 |
| CN | 103163671 A | 6/2013 |

OTHER PUBLICATIONS

First Chinese Office Action dated Jul. 17, 2015; Appln. No. 201310183646.3.
(Continued)

*Primary Examiner* — Andrew Sasinowski
*Assistant Examiner* — Chun-Nan Lin
(74) *Attorney, Agent, or Firm* — Ladas & Parry LLP

(57) ABSTRACT

The present invention provides a touch screen and a display device with better touch effect. The touch screen includes: a first substrate, a plurality of first touch electrodes distributed along a first direction on the first substrate, and a first insulating layer between the first substrate and the first touch
(Continued)

electrodes; and a plurality of second touch electrodes distributed along a second direction intersecting the first direction, wherein uneven areas are provided on one side of the first insulating layer facing the first touch electrodes at regions corresponding to each of the first touch electrodes, and the first touch electrodes are disposed on the first insulating layer according to its shape, forming corresponding uneven areas.

18 Claims, 8 Drawing Sheets

(56) References Cited

U.S. PATENT DOCUMENTS

| | | | | |
|---|---|---|---|---|
| 2011/0157086 A1* | 6/2011 | Ozeki | ............... | G06F 3/044 345/174 |
| 2011/0187676 A1* | 8/2011 | Chang | ............... | G06F 3/044 345/174 |
| 2011/0193793 A1* | 8/2011 | An | ............... | G06F 3/044 345/173 |
| 2011/0227850 A1* | 9/2011 | Oh | ............... | G02F 1/13338 345/173 |
| 2011/0227851 A1* | 9/2011 | Oh | ............... | G02F 1/13338 345/173 |
| 2013/0076689 A1* | 3/2013 | Li | ............... | G06F 3/044 345/174 |
| 2014/0125626 A1 | 5/2014 | Yang et al. | | |

OTHER PUBLICATIONS

Second Chinese Office Action Appln. No. 201310183646.3; dated Oct. 20, 2015.

International Search Report Appln. No. PCT/CN2013/090459; Dated Mar. 17, 2014.

International Preliminary Report on Patentability dated Nov. 17, 2015; PCT/CN2013/090459.

* cited by examiner

TOUCH SCREEN AND DISPLAY DEVICE

FIELD OF THE INVENTION

The present invention relates to the field of display technology, particularly to a touch screen and a display device.

BACKGROUND

Display screens with touch function in prior art have become the main stream in the display field due to their characteristics such as simple structure, light weight, thin thickness and low cost.

Touch screens mainly include capacitive touch screens, resistive touch screens and optical touch screens. Capacitive touch screens are popular and commonly used touch screens.

The touch principle of a capacitive touch screen will be described briefly below with respect to the structure of a touch screen.

FIG. 1 is a top schematic diagram of a capacitive touch screen including touch driving electrodes 800 disposed transversely and touch sensing electrodes 900 disposed vertically with mutual capacitances Cm generated by coupling between adjacent touch driving electrodes 800 and touch sensing electrodes 900. When a finger touches the screen, the touch of the finger will change the value of the mutual capacitance Cm. The location of finger touch is detected by detecting change of a current corresponding to the capacitance Cm before and after touch by a touch detection device. The finger changes the value of the mutual capacitance Cm by changing electric field between the touch driving electrode 800 and the touch sensing electrode 900.

Referring to FIG. 2 that is a schematic cross section of the touch driving electrode 800 and the touch sensing electrode 900 shown in FIG. 1, when a voltage is applied to the touch driving electrode 800 and the touch sensing electrode 900, an electric field is formed between them. In FIG. 2, the electric field line is denoted by the line segment with arrow. The electric field formed between the touch driving electrode 800 and the touch sensing electrode 900 includes two components, that is, a forward electric field formed between opposed overlapping surfaces of the touch driving electrode 800 and the touch sensing electrode 900 and a projection electric field formed between non-overlapping surfaces (in the present invention, overlapping surface refers to the overlapping surface formed by orthogonal projections of the touch driving electrode and the touch sensing electrode in the same plane). A finger can only change the value of mutual capacitance Cm by changing electric field projected outside the touch driving electrode 800 and the touch sensing electrode 900. The forward electric field is adverse to improving touch effect of the touch screen. The lager the area of the touch sensing electrode, the larger the projection electric field between the touch sensing electrode and the touch driving electrode, but at the same time, the larger the forward electric field between the touch sensing electrode and the touch driving electrode. When a large mutual capacitance is formed between directly opposed electric fields, large detection initial value of the touch detection device will be caused. It is impossible to accurately detect slight change of the projection electric field after the finger touches the touch screen, hence leading to poor touch effect of the touch screen.

SUMMARY

Embodiments of the present invention provide a touch screen and a display device for realizing a touch screen and a display device with better touch effect.

The touch screen provided in an embodiment of the present invention includes: a first substrate, a plurality of first touch electrodes distributed along a first direction on the first substrate, and a first insulating layer between the first substrate and the first touch electrodes. The touch screen further includes a plurality of second touch electrodes distributed along a second direction intersecting the first direction.

Wherein, uneven areas are provided on one side of the first insulating layer facing the first touch electrodes at regions corresponding to each of the first touch electrodes, the first touch electrodes are disposed on the first insulating layer according to its shape, forming corresponding uneven areas.

For example, uneven areas on the first insulating layer are one or more recessed areas with smooth surfaces.

For example, the recessed areas are groove shaped areas extending in the first direction, or a plurality of hole shaped areas distributed along the first direction.

For example, the groove shaped areas have longitudinal section along a second direction of trapezoid, triangle or arc shape.

For example, the groove shaped areas have longitudinal section along a second direction of isosceles trapezoid, isosceles triangle or circular arc shape.

For example, gaps between any two adjacent hole shaped areas among the plurality of hole shaped areas are equal.

For example, the second touch electrodes are located on and insulated from the first touch electrodes so that one side of the first insulating layer having recessed areas faces the second touch electrodes.

For example, a color resin layer between the first substrate and the first insulating layer is further provided on the first substrate; a second substrate disposed oppositely to one side of the first substrate having first touch electrodes is further included; a plurality of sub-pixel units arranged in matrix corresponding to the color resin layer are provided on one side of the second substrate close to the first substrate, and the second touch electrodes are disposed over the sub-pixel units.

For example, the touch screen further includes a black matrix located between the color resin layer and the first substrate, the black matrix corresponds to non-display areas between adjacent rows and adjacent columns of pixel units, and the first touch electrodes are disposed in regions corresponding to the black matrix.

For example, the first insulating layer is a silicon oxide layer, a silicon nitride layer or an organic resin layer.

An embodiment of the present invention further provides a display device including the above-mentioned touch screen.

According to the present invention, the surface area of the first touch electrode is increased by providing uneven areas on the first touch electrode, while the perpendicular overlapping surface between the second touch electrode and the first touch electrode will not be increased by the provision of uneven areas. The direct opposing electric field corresponding to the perpendicular overlapping areas between the second touch electrodes and the first touch electrodes is not changed, and the projection electric field is increased, and thus the ratio of the projection electric field to the direct opposing electric field is increased. When a finger touches the touch screen, magnitude of the projection electric field is changed. The touch detection device determines the location of touch point by detecting difference of current values or voltage values before and after finger touch. According to the present invention, since the ratio of projection electric field to direct opposing electric field is increased, the detection initial value of the touch detection device decreases, and thus it becomes possible to accurately detect slight change of the projection electric field after the finger touches the touch screen, and hence touch effect of the touch screen is improved.

BRIEF DESCRIPTION OF DRAWINGS

In order to clearly illustrate the technical solution of the embodiments of the invention, drawings of the embodiments will be briefly described in the following. It is obvious that the described drawings are only related to some embodiments of the invention and thus are not limitative of the invention.

DETAIL DESCRIPTION

Figure 1:
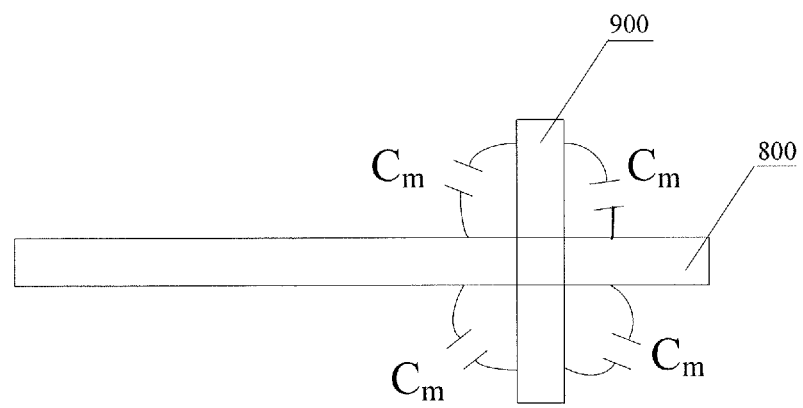
FIG. 1 is a top schematic diagram of a prior art capacitive touch screen.
Figure 2:
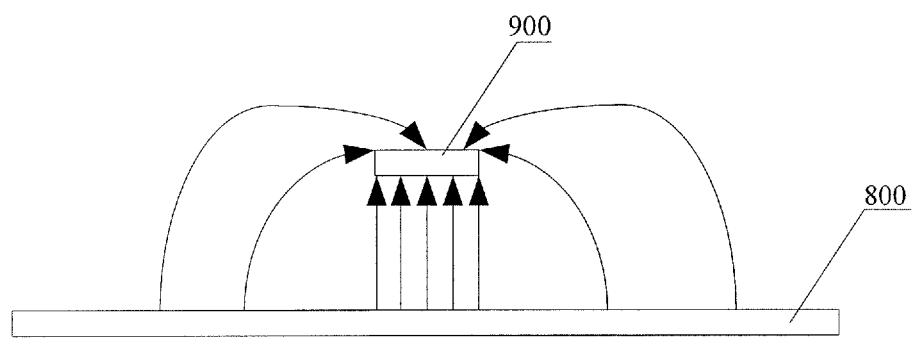
FIG. 2 is a schematic cross section of a capacitive touch screen shown in FIG. 1.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the present invention provide a touch screen and a display device for realizing a touch screen and a display device with better touch effect.

According to the present invention, the surface area of the first touch electrode is increased by providing uneven areas on the first touch electrode. The perpendicular overlapping surface between the second touch electrode and the first touch electrode is not increased due to the provision of uneven areas, which increases the projection electric field between the second touch electrode and the first touch electrode and improves the touch effect of the touch screen.

It is to be noted that any touch screen in which uneven areas are provided on the first touch electrode is included in the scope of the present invention and the touch screen provided in embodiments of the present invention may be any capacitive touch screen. For example, the touch screens provided in embodiments of the present invention may be classified according to setting modes into add on touch screen or on cell or in cell touch screen integrated in the display screen. In terms of structure, the second touch electrode and the first touch electrode may be located on the same substrate, on one side of the same substrate or two sides of the same substrate; or located on different substrates. The first touch electrode may be a touch driving electrode or a touch sensing electrode, and the second touch electrode may be a touch sensing electrode or a touch driving electrode. In an embodiment of the present invention, description is given with an example in which the first touch electrode is a touch sensing electrode and the second touch electrode is a touch driving electrode.

The touch screen provided in an embodiment of the present invention includes at least: a first substrate, a plurality of first touch electrodes distributed along a first direction on the first substrate, a plurality of second touch electrodes distributed along a second direction intersecting the first direction, and further includes an insulating medium layer between the first touch electrodes and the second touch electrodes for insulating them.

Wherein, uneven areas are provided on one side of the insulating medium layer facing the first touch electrode at regions corresponding to the first touch electrodes. The uneven areas of the first touch electrodes are formed by forming uneven areas on the insulating medium layer and hence the sensitivity of touch is improved.

The touch screen provided in an embodiment of the present invention further includes a plurality of second touch electrodes distributed along a second direction intersecting the first direction. Wherein, uneven areas are provided on one side of the first insulating layer facing the first touch electrodes at areas corresponding to each first touch electrode, and the first touch electrodes are disposed on the first insulating layer according its shape, forming corresponding uneven areas.

When compared with flat areas, in all uneven areas in embodiments of the present invention (including at least uneven areas of the insulating medium layer, uneven areas of the first insulating layer and uneven areas of the first touch electrodes), the surface of the first touch electrodes with uneven areas is not flat but curved.

All the uneven areas in embodiments of the present invention may be, but not limited to recessed areas, convex areas, or both recessed areas and convex areas. It is to be noted that any first touch electrodes with curved surfaces may increase the projection electric field between the second touch electrodes and the first touch electrodes and enhance the touch effect of the touch screen. That is, any first touch electrodes with curved surfaces fall within the scope of the present invention.

The touch screen and the display device provided in the present invention will be described illustratively with recessed areas as an example.

For example, the recessed areas may be, but not limited to groove areas or hole areas.

The touch screen provided in the present invention will be described below with reference to different embodiments.

Embodiment I: Touch Screen with Recessed Areas of Groove Shape

Figure 3:
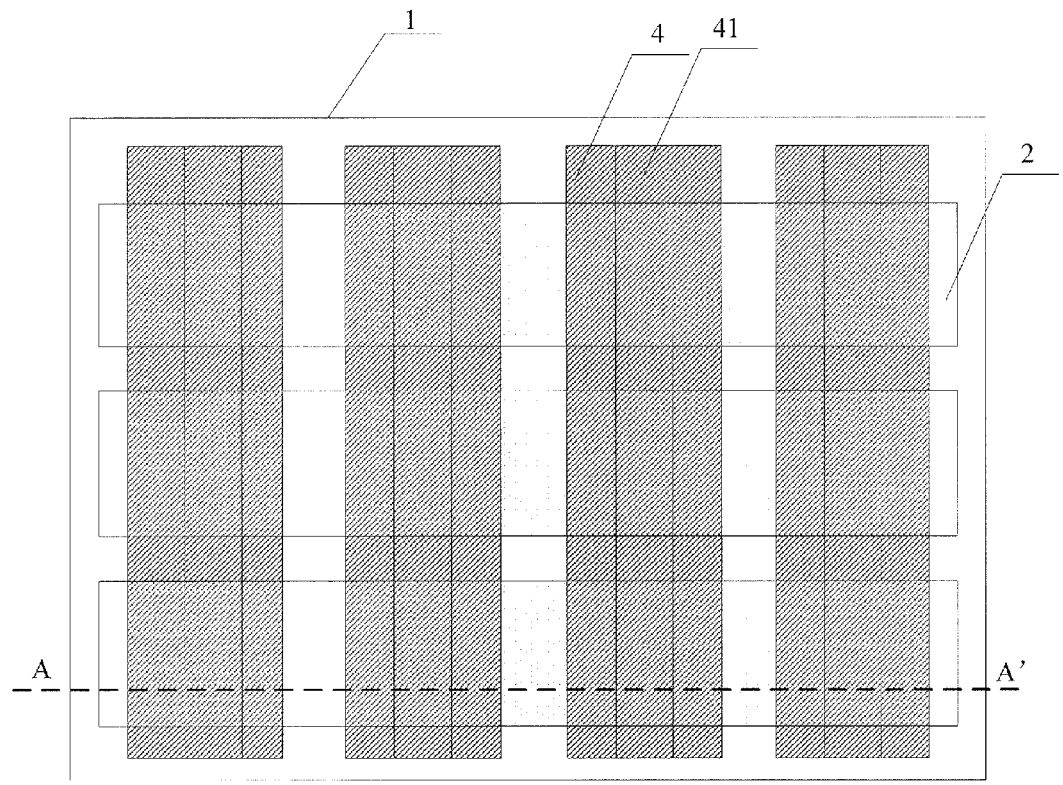
FIG. 3 is a top schematic diagram of a touch screen according to embodiment I of the present invention.

Referring to FIG. 3, which shows a top schematic diagram of a touch screen according to embodiment I, the touch screen includes a first substrate 1, a first insulating layer (not shown in FIG. 3) on the first substrate 1, a plurality of first touch electrodes distributed along a first direction on the first insulating layer, and a plurality of second touch electrodes 2 distributed along a second direction on the first touch electrodes 4. Wherein groove shaped areas 41 are provided on one side of the first insulating layer facing the first touch electrodes 4 at areas corresponding to each first touch electrode 4. The first touch electrodes 4 are disposed on the first insulating layer according to its shape, forming corresponding groove shaped areas 41, wherein the first direction and the second direction are intercross. FIG. 3 illustratively shows the first direction is a longitudinal direction and the second direction is a transverse direction.

It is to be noted that in FIG. 3, as an example, there is a first insulating layer between the first substrate and the first touch electrode (first touch electrode). Those skilled in the art can understand that it is also possible that the second touch electrodes are directly formed on the first substrate, first touch electrodes are formed on one side of the second touch electrodes apart from the first substrate, and the second touch electrodes and the first touch electrodes are insulated from each other via the insulating medium layer, as long as it is ensured that the insulating medium layer between the first touch electrodes and the second touch electrodes has uneven areas such that overlapping surfaces of the first touch electrodes and the second touch electrodes are not increased while increasing areas of the first touch electrodes, hence improving sensitivity of touch.

In order to describe the structure of touch screen shown in FIG. 3 more clearly, detail description will be given with reference to FIG. 4 below, which is a schematic cross section along direction A-A' of the touch screen shown in FIG. 3.

Figure 4:
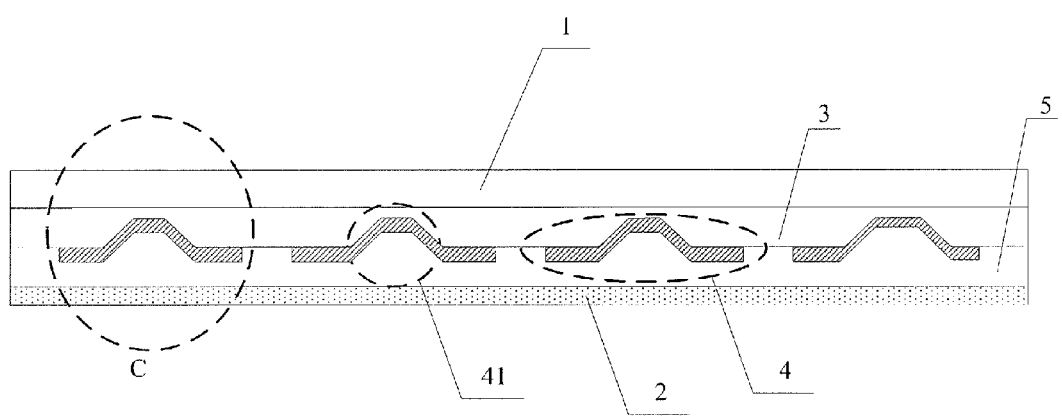
FIG. 4 is a sectional view along direction A-A' of the touch screen shown in FIG. 3.

Referring to FIG. 4, the first insulating layer 3 is located on the first substrate 1; the first touch electrode 4 is located on the first insulating layer 3, the second insulating layer 5 (i.e., insulating medium layer) is located on the first touch electrode 4; and the second touch electrode 2 is located on the second insulating layer 5. The first insulating layer 3 has recessed areas 4 thereon facing the first touch electrodes 4, and the first touch electrodes 4 are disposed on the first insulating layer 3 according to its shape, forming corresponding groove-shaped areas 41.

The principle for the touch screen provided in embodiment I for improving touch effect will be described below.

Figure 5:
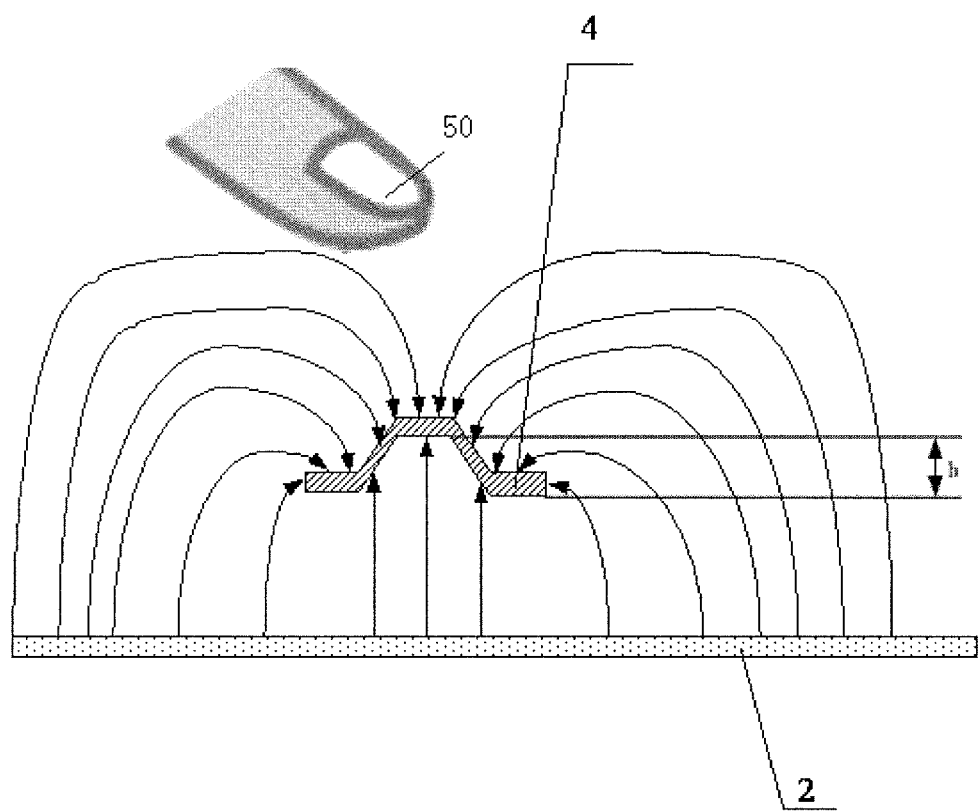
FIG. 5 is a partial enlarged drawing of area C of the touch screen shown in FIG. 4.

Referring to FIG. 5, which is a partial enlarged schematic diagram of area C of the touch screen shown in FIG. 4, the area C includes a second touch electrode 2 and a first touch electrode 4 with an electric field formed therebetween. The line segment with arrow in FIG. 5 represents electric field lines. In comparison to the tabular first touch electrode (that is, the first touch electrode with flat surface). Due to the fact that the first touch electrode 4 in embodiments of the present invention includes uneven areas, surface area of the first touch electrode 4 is enlarged while perpendicular overlapping surface between the second touch electrode 2 and the first touch electrode 4 is not enlarged. Due to enlargement of surface area of the first touch electrode 4, the projection electric field increases, and the ratio of the projection electric field to the direct opposing electric field corresponding to the overlapping surface is increased. When a finger 50 touches the touch screen, the projection electric field is changed. The touch detection device determines the location of touch point by detecting difference of current values or voltage values before and after finger touch. When the ratio of projection electric field to direct opposing electric field is increased, the detection initial value of the touch detection device decreases, and then it is possible to accurately detect slight change of the projection electric field after the finger touches the touch screen, hence improving touch effect of the touch screen.

It is to be noted that the groove shaped areas may be sized according to patterning process conditions and size of touch screen, for example, according to patterning process conditions and width of the first touch electrodes, which is not limited here. For example, in case the patterning process conditions allow, the size of the touch screen is large, and the width of the first touch electrodes is large, groove shaped areas may be larger. On the contrary, if the touch screen is of small size, and the first touch electrodes have small width, the groove shaped areas may be made smaller.

Referring to FIG. 5, theoretically, the larger the depth h of recessed areas disposed on the first touch electrode, the larger the surface area of the first touch electrode, with constant overlapping area between the second touch electrode 2 and the first touch electrode 4, the larger the projection electric field between the second touch electrode 2 and the first touch electrode 4, the ratio of the projection electric field to the direct opposing electric field, the smaller the detection initial value of the touch detection device, and the more accurately it is possible to detect slight change of projection electric field signal after the finger touches the touch screen. That is in favor of improving touch effect of touch screen. Therefore, it is possible to form recessed areas with suitable depth on the first insulating layer according to practical requirements and in turn form corresponding recessed areas with a certain depth on the first touch electrodes, which is not limited specifically here.

For example, in case that the process conditions allow, the width of recessed areas may be set to slightly smaller than the distance between two long sides of the first touch electrode.

Figure 6:
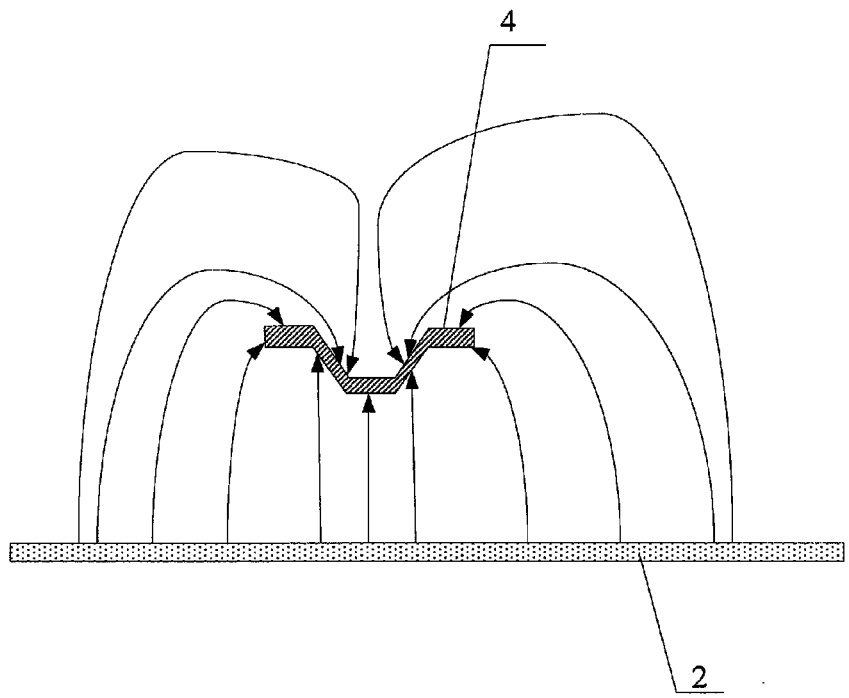
FIG. 6 shows a touch screen in which a section of recessed area is trapezoid shape provided in embodiment I.

For the touch screen provided in embodiment I of the present invention, the arrangement of the second touch electrodes is not limited to over the first touch electrodes, and may also be under the first touch electrodes, as shown in FIG. 6, and the second touch electrodes 2 may be located between the first substrate and the first insulating layer. In this case, one side of the first insulating layer having uneven areas is opposite to the second touch electrodes 2. FIG. 6 shows only the second touch electrodes 2 and the first touch electrodes 4.

In comparison to the arrangement of tabular shaped first touch electrodes, the touch screen shown in FIG. 6 may improve touch effect of the touch screen. In comparison to the arrangement of the second touch electrodes 2 and the first touch electrodes 4 shown in FIG. 5, the projection electric field between the second touch electrodes 2 and the first touch electrodes 4 is small.

That is, in the present invention, when the recessed sides of the recessed areas of the first touch electrodes face the second touch electrodes, the touch effect is better.

For example, arrangement of groove shaped areas on the first touch electrodes provided in embodiment I of the present invention may have a plurality of options. For example, in case that patterning process allow, longitudinal section of groove shaped areas along the second direction (along the arrangement direction of the second touch electrodes) may be trapezoid, rectangle, circular arc or triangle. The sectional view of the first touch electrodes provided in FIGS. 3-6 along the second direction is trapezoid. The shape of sectional view of groove shaped areas along the second direction may be determined according to patterning process conditions and width of the first touch electrodes, which is not limited here.

Figure 7:
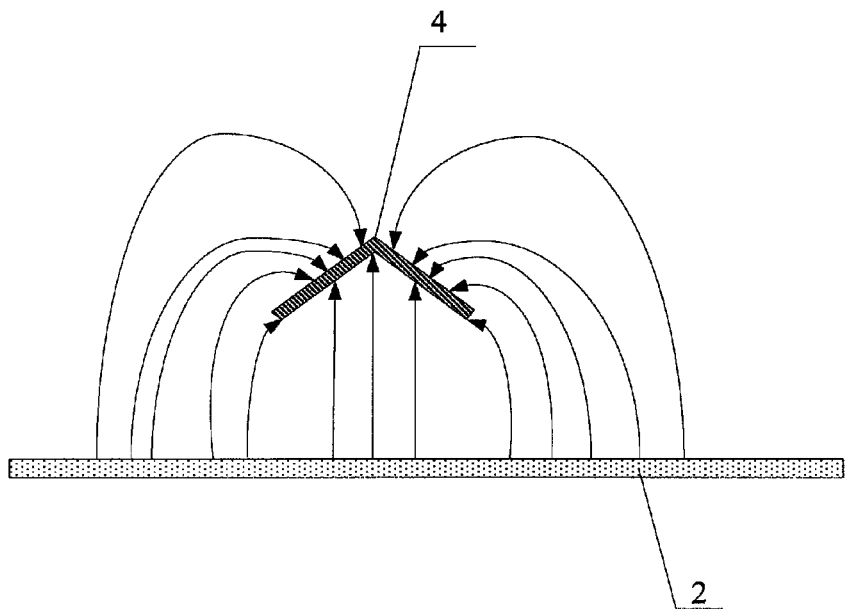
FIG. 7 shows a touch screen in which a section of recessed area is triangle shape provided in embodiment I.

FIG. 7 shows a first touch electrode with a triangle longitudinal section in the second direction provided in embodiment I of the present invention.

Figure 8:
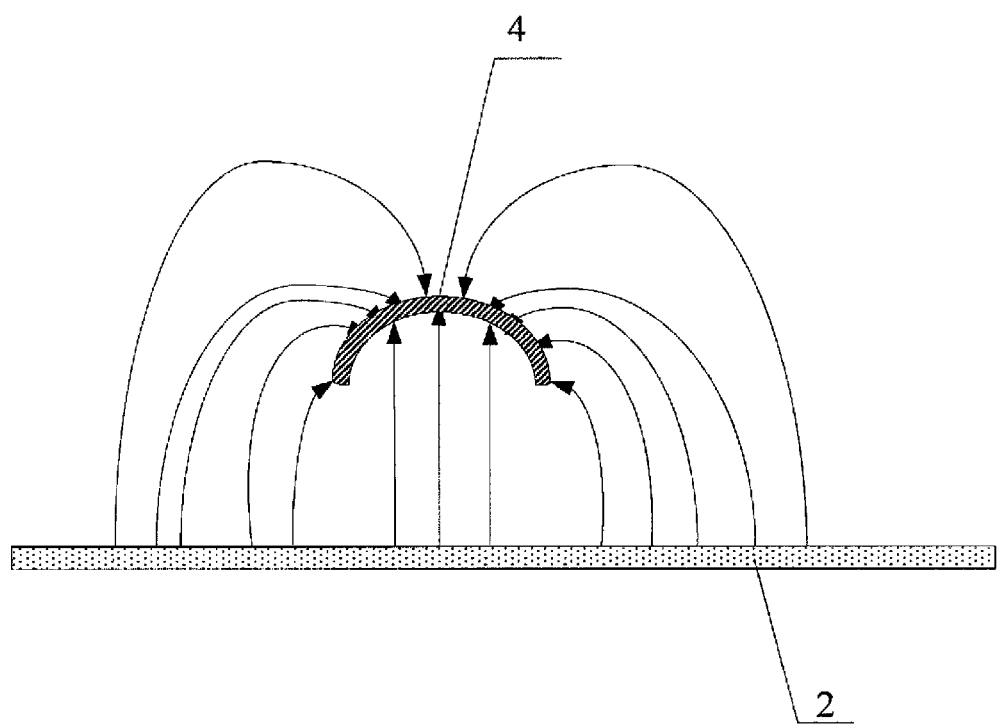
FIG. 8 shows a touch screen according to embodiment I in which a section of recessed area is circular arc.

FIG. 8 shows a first touch electrode with an arc section in the second direction provided in embodiment I of the present invention.

For example, in order to ensure that strength of projection electric field on both sides of the first touch electrodes is consistent as good as possible and ensure relative consistent touch effect at various locations on the entire touch screen, the longitudinal section of recessed areas along the second direction may be of shape of isosceles triangle, isosceles trapezoid or a part of a circle (circular arc).

With the touch screen provided in the above-mentioned embodiment I, one groove shaped area is provided on the first touch electrode, alternatively, two or more groove shaped areas parallel with each other may be provided. The number of groove shaped areas on the first touch electrodes may be set according to the width of first touch electrodes and process conditions, which is not specifically limited here.

Embodiment II: Touch Screen with Recessed Areas of Hole Shape

Figure 9:
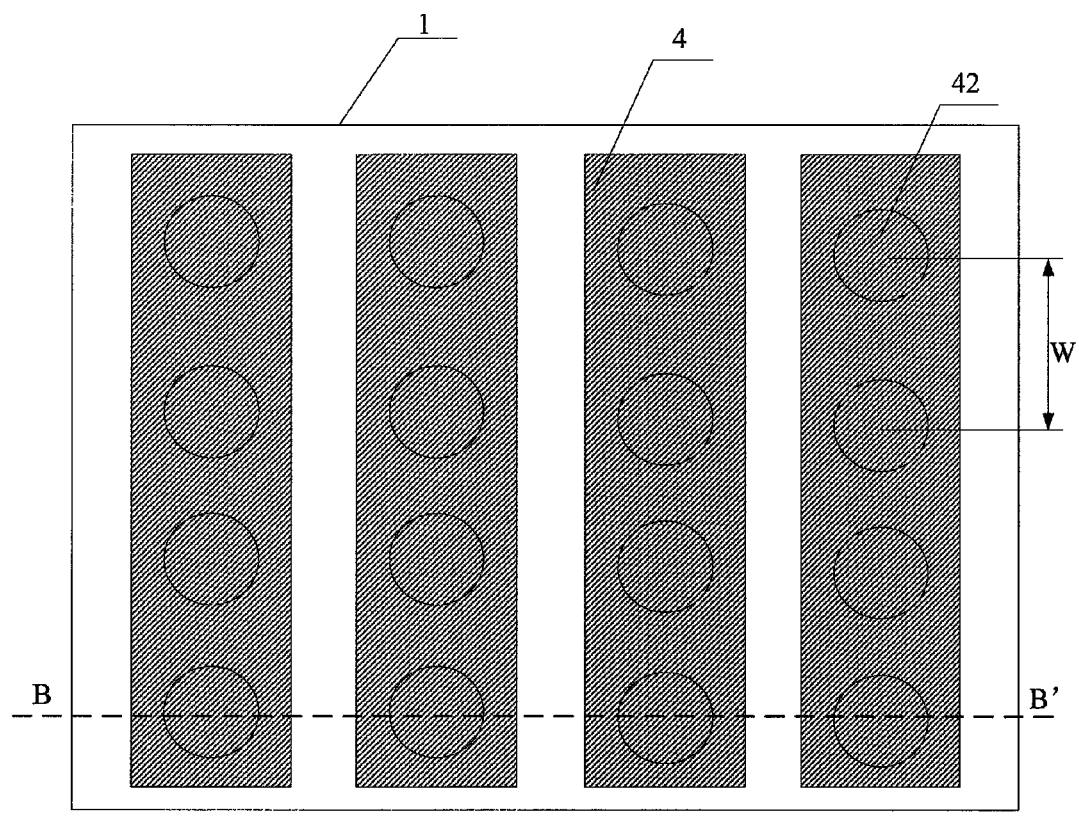
FIG. 9 is a top schematic diagram of a touch screen according to embodiment II of the present invention.

Referring to FIG. 9, which is a top schematic diagram of the touch screen provided in embodiment II, similar to the touch screen provided in embodiment I in terms of structure, which includes: a first substrate 1, a first insulating layer (not shown in FIG. 9) on the first substrate 1, a plurality of first touch electrodes 4 distributed in the first direction on the first insulating layer, and a plurality of second touch electrodes (not shown in FIG. 9) distributed in a second direction on the first touch electrodes 4.

Embodiment II of the touch screen differs from that of embodiment I in that: a plurality of hole shaped areas 42 are provided on a side of the first insulating layer that facing the first touch electrodes 4 at regions corresponding to each first touch electrode 4; and the first touch electrodes 4 are provided on the first insulating layer according to its shape, forming corresponding hole shaped areas 42.

Figure 10:
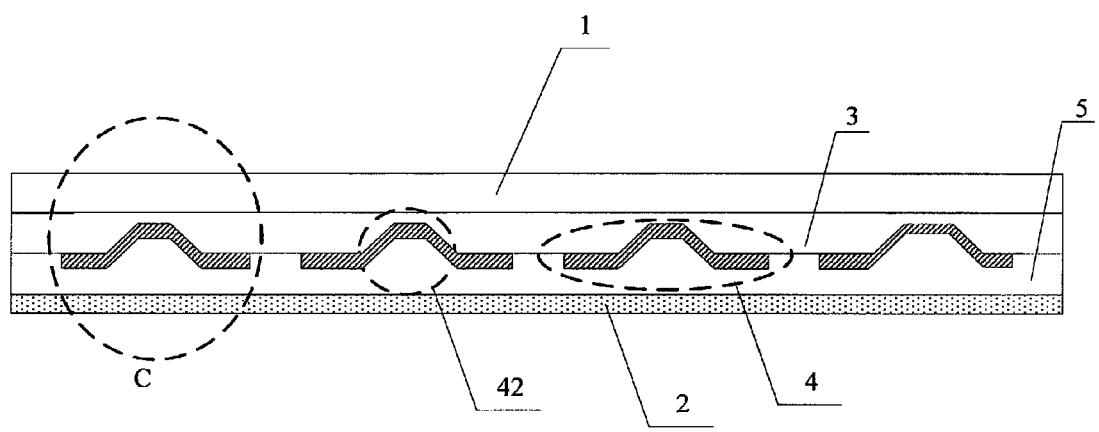
FIG. 10 is a sectional view along direction B-B' of the touch screen as shown in FIG. 9.

Referring to FIG. 10, which is a schematic cross section of the touch screen shown in FIG. 9 along direction B-B', the second touch electrodes 2 are located on the first touch electrodes 4, and insulated from the first touch electrodes 4 by the second insulating layer 5.

For example, referring to FIG. 10, the diameter of one end of the hole shaped area 42 close to the insulating layer 3 is smaller than that of the end apart from the insulating layer 3. The maximum diameter of the hole shaped area 42 is slightly smaller than the distance between two long sides of the first touch electrode 4. Alternatively, the maximum diameter is, for example, ½ or ⅓ etc. of the distance between two long sides of the first touch electrode 4, which may be determined according to requirements and patterning process conditions and is not limited here.

For example, referring to FIG. 9, hole shaped areas 42 on each first touch electrode 4 are arranged in one or more columns along the first direction. As an example, only one column of hole shaped areas 42 is shown in FIG. 9.

For example, referring to FIG. 9, the gap Ws between any two adjacent hole shaped areas 42 among hole shaped areas 42 on each first touch electrode 4 are equal.

It is to be noted that the above-mentioned arrangement, gap and upper and bottom diameters of hole shaped areas are all illustrative, which may be determined according to process conditions and the width of the first touch electrodes in practice and are not limited in any way here.

The electric field formed between the second touch electrodes and the first touch electrodes provided in embodiment II is similar to that formed between the second touch electrodes 2 and the first touch electrodes 4 shown in FIG. 5. Since the first touch electrodes have a plurality of hole shaped areas that endow them with large surface area, the projection electric field between second touch electrodes is accordingly large, and the touch effect is relatively significant.

For example, the second touch electrodes and the first touch electrodes are provided on the same substrate, and recessed sides of hole shaped areas of the first touch electrodes face the second touch electrodes. Such an arrangement may further enhance the projection electric field between the second touch electrodes and the first touch electrodes.

The second touch electrodes and the first touch electrodes of the touch screens provided in embodiment I and embodiment II are described with an example in which both of them are located on the same substrate. However, the arrangement of the second touch electrodes and the first touch electrodes is not limited to the structures shown in embodiment I and embodiment II. For example, the second touch electrodes and the first touch electrodes may be disposed on the same side or two sides of the same substrate. When the second touch electrodes and the first touch electrodes are disposed on the same side of the substrate, relative locations of the second touch electrodes and the first touch electrodes may be interchanged, as long as it is ensured that recessed sides of recessed areas of the first touch electrodes face the second touch electrodes, of which details are omitted herein.

The touch screen may be an add on touch screen independent of a display screen, or an in-cell touch screen integrated in a color filter substrate or an array substrate of the display screen. Alternatively, the first touch electrodes and the second touch electrodes are integrated in the color filter substrate and the array substrate, respectively.

The touch screen according to the present invention will be described further with an example in which the first touch electrodes having recessed areas provided in embodiment I or embodiment II are integrated.

Figure 11:
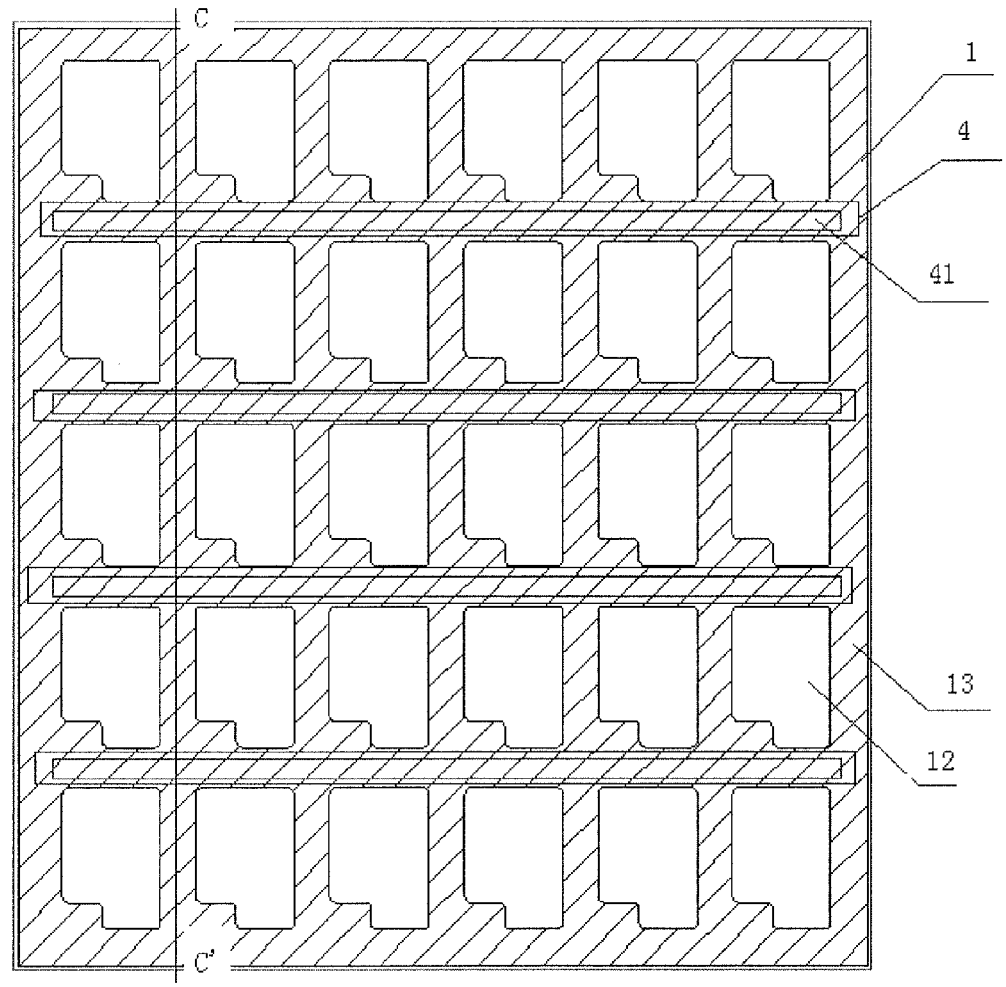
FIG. 11 is a top schematic diagram of a touch screen according to embodiment III, with recessed areas as provided in embodiment II.

Embodiment III: First Touch Electrodes Disposed on Color Filter Substrate, and Second Touch Electrodes Disposed on Array Substrate Referring to FIG. 11, the touch screen includes: a first substrate 1 and a second substrate (not shown in FIG. 11) disposed oppositely; a color resin layer 12 located on the first substrate 1; a first insulating layer located on the color resin layer 12 (not shown in FIG. 11), a plurality of first touch electrodes 4 distributed along a first direction on the first insulating layer; wherein the first insulating layer has recessed areas corresponding to each first touch electrode 4 on a side facing the first touch electrodes 4. FIG. 11 illustratively shows the case in which corresponding recessed areas are groove shaped areas 41. The first touch electrodes 4 are disposed on the first insulating layer according to its shape and form corresponding recessed areas. The touch screen further includes: a plurality of sub-pixel areas arranged in matrix (not shown in FIG. 11) corresponding to the color resin layer 12 on the second substrate 6.

Figure 12:
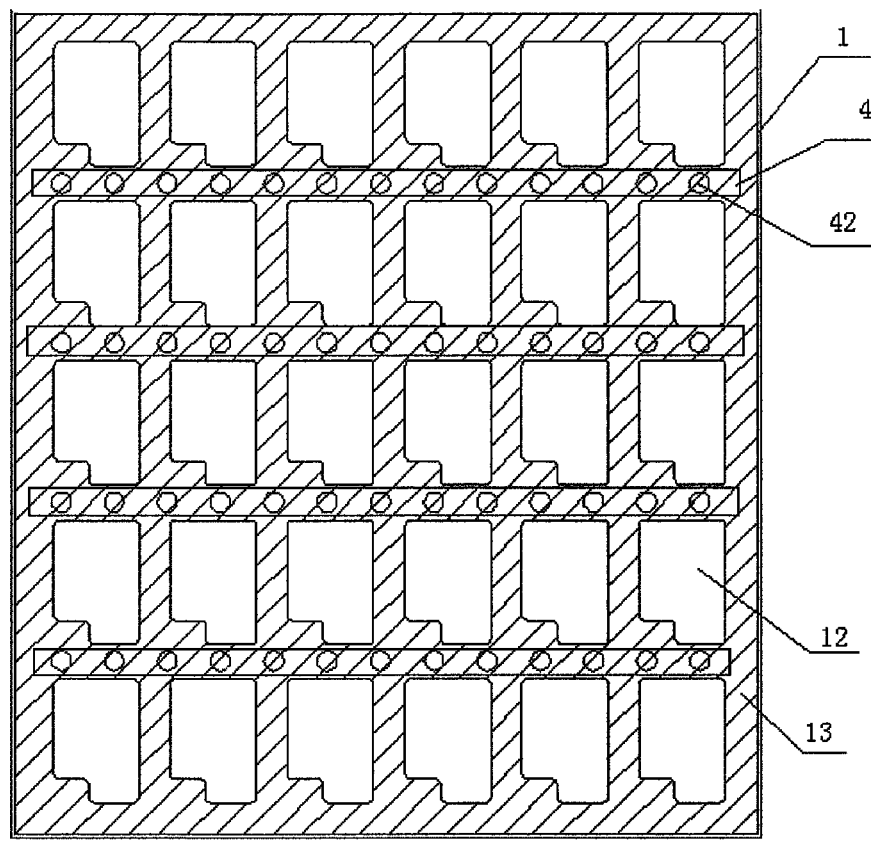
FIG. 12 is a top schematic diagram of a touch screen according to embodiment III, with recessed areas as provided in embodiment I.

FIG. 12 illustratively shows another touch screen with recessed areas of hole shaped areas 42.

The display screen provided in embodiment III may be a liquid crystal display or an organic illuminating display screen.

Figure 13:
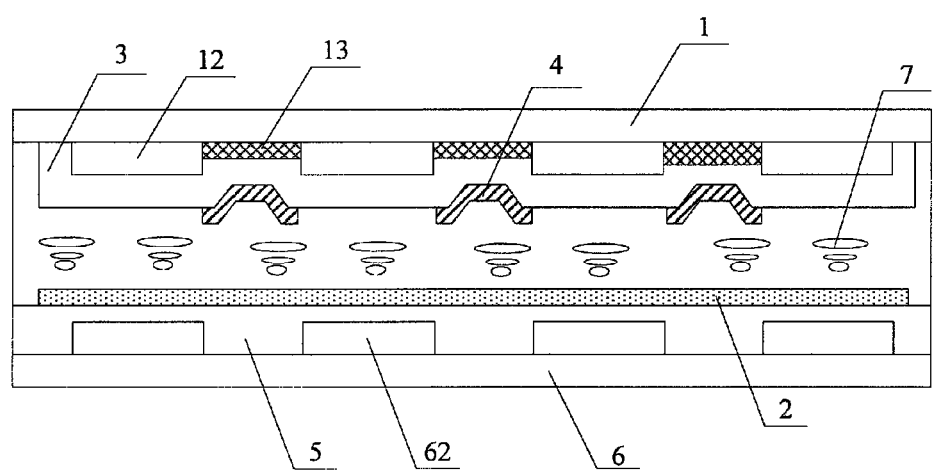
FIG. 13 is a schematic cross section of a touch screen according to embodiment III.

FIG. 13 is a sectional view in C-C' direction of the touch screen shown in FIG. 11, in which the second touch electrodes and the first touch electrodes are integrated in the liquid crystal screen.

Referring to FIG. 13, the touch screen includes: a liquid crystal layer 7 between the first substrate 1 and the second substrate 6; a plurality of color resin layers 12 arranged in matrix on a side of the first substrate 5 close to the liquid crystal layer 7; a black matrix 13 between adjacent rows and adjacent columns of color resin layers 12; a first insulating layer 3 on the black matrix 13 having recessed areas; first touch electrodes 4 distributed along a first direction on the first insulating layer 3, forming recessed areas corresponding to recessed areas on the first insulating layer 3. The touch screen further includes a plurality of sub-pixel units 62 arranged in matrix on a side of the second substrate 6 close to the liquid crystal layer 7, a second insulating layer 5 on the plurality of sub-pixel units 62, and second touch electrodes 2 distributed along a second direction intersecting the first direction on the second insulating layer 5. The first direction is shown as the longitudinal direction in FIG. 11, and the second direction is the transverse direction.

For example, recessed areas are groove shaped or hole shaped areas provided in embodiment I or embodiment II. As the surface areas of the first touch electrodes with recessed areas increase, the projection electric field between the second touch electrodes increases too.

For example, the first touch electrodes are located at areas corresponding to the black matrix, which will not influence opening ratio and light transmission rate of pixels.

For example, the first insulating layer is an organic resin layer or an inorganic insulating layer. For example, the first insulating layer is an organic photoresist layer or an inorganic silicon oxide layer, silicon nitride layer or silicon oxynitride layer.

A planarization layer may be further provided on a side of the first touch electrodes close to the liquid crystal layer, and the planarization layer is typically made of organic resin material. The first insulating layer provided in an embodiment of the present invention may be made of a material same as that for the planarization layer, which could improve adhesion of the first touch electrodes on the black matrix layer so as to prevent the first touch electrodes from peeling off easily.

For example, the second touch electrodes are common electrodes for realizing image display. The common electrodes are driven in a time division manner such that in an image display state, the common electrodes are applied with a Vcom voltage signal to implement image display. In a touch stage, the common electrodes are applied with a high frequency voltage signal to implement touch. Such a configuration simplifies the structure of in-cell touch screen, saves manufacturing costs of products and improves products' competitive power.

For example, the recessed sides of recessed areas of the first touch electrodes face the second touch electrodes, which may increase the projection electric field between the second touch electrodes and the first touch electrodes, and enhance the touch effect of the touch screen.

It is to be noted that although in the in-cell touch screen provided in the above-mentioned embodiment III, the second touch electrodes are disposed on the second substrate, and the first touch electrodes are disposed on the first substrate, in practical implementations, it is not limited to the configuration of embodiment III. Any technical solution having the first touch electrodes with recessed areas provided in all embodiments of the present invention is included in the scope of the present invention, and such examples will not be enumerated here.

With the first touch electrodes provided in embodiments of the present invention, their recessed areas are explained with grove shaped and hole shaped areas as an example. However, recessed areas are not limited to groove shaped and hole shaped areas, and any first touch electrode with a curved surface and capable of improving touch effect is included in the scope of the present invention, which is not enumerated here.

It is to be noted that technology solutions provided in the present invention are explained with respect to only three embodiments in the present invention, but the touch screens described in the present invention are not limited to the touch screen structures provided in embodiment I to embodiment III, and may be any capacitive touch screen structures, for example, any in-cell touch screen and add on touch screen. Any touch screen containing first touch electrodes with uneven areas described in the present invention is included in the scope of the present invention.

In addition, the present invention is described here with strip-shaped second touch electrodes and strip-sheaped first touch electrodes as an example. However, the shape of electrodes is not limited thereto. For example, it is possible that the second touch electrode or the first touch electrode consists of serially connected rhombus shaped or rectangle shaped electrode units, which is not limited here.

The method of manufacturing the first touch electrodes provided in the present invention will be described briefly below with the first substrate in the in-cell touch screen provided in embodiment III as an example (that is, with partial structure in the touch screen provided in FIG. 13 as an example).

Step 1: forming color resin layers arranged in matrix and a black matrix on a first substrate according to prior art technical process;

Step 2: on the basis of step 1, forming an insulating layer on the first substrate with coating process, wherein the insulating layer may be an organic resin layer or an inorganic insulating layer, in which the former will be taken as an example hereinafter.

Step 3: exposing and developing the organic resin layer to form recessed areas at regions corresponding to the black matrix with a depth not larger than the thickness of the organic resin layer, which may be groove shaped recessed areas or hole shaped recessed areas.

Step 4: forming a metal film layer on the organic resin layer having recessed areas with coating process, and forming a plurality of first touch electrodes arranged parallel with one another in the black matrix area with exposing, developing, photolithography and etching processes. Now, the organic resin layer right below the first touch electrodes is a film layer having recessed areas and the first touch electrodes cover the recessed areas to form an electrode film layer having recessed areas.

Step 5: forming a planarization layer covering the entire first substrate on the first touch electrodes.

It can be seen that in the present invention, it is only required to provide recessed areas on the insulating layer contacting the first touch electrodes so that the first touch electrodes naturally form electrodes having respective recessed areas, hence simplifying technical process of the first touch electrodes.

An embodiment of the present invention further provides a display device including any touch screen and display panel provided in the embodiments of the present invention. When the touch screen is an add on touch screen, the touch screen is hung over the display panel. When the touch screen is an in-cell touch screen, the touch screen is integrated in the display panel.

The display device may be a display device such as a liquid crystal panel, a liquid crystal display, a liquid crystal TV, an organic electroluminescence display OLED panel, an OLED display, an OLED TV or electronic paper and etc.

In the embodiments of the present invention, the surface area of the first touch electrodes is increased and projection electric field between the second touch electrodes and the first touch electrodes is enhanced by providing the first touch electrodes in the touch screen with uneven areas. Providing first touch electrodes with large surface area in the black matrix area with limited width enhances the touch effect of the touch screen without influencing opening ratio of the in-cell touch screen and the transmittance of light.

What have been described above are only exemplary implementations of the present invention, the protection scope of the present invention is not limited thereto. Variations or substitutions that easily occur to those skilled in the art within the technology scope disclosed in the present invention should be encompassed in the protection scope of the present invention. The protection scope of the present invention is defined by the appending claims.

The invention claimed is:

1. A touch screen comprising: a first substrate, a plurality of first touch electrodes distributed along a first direction on the first substrate, a plurality of second touch electrodes distributed along a second direction intersecting the first direction, and an insulating medium layer between the first touch electrodes and the second touch electrodes for insulating the first touch electrodes and the second touch electrodes from each other:

wherein uneven areas are provided on one side of the insulating medium layer facing the first touch electrode at regions corresponding to the first touch electrodes, wherein the touch screen further comprises a first insulating layer between the first substrate and the first touch electrodes, and wherein uneven areas are provided on one side of the first insulating layer facing the first touch electrodes at regions corresponding to each of the first touch electrodes, and the first touch electrodes are disposed on the first insulating layer according to its shape, forming uneven areas of the first touch electrodes, and wherein uneven areas on the first insulating layer are one or more recessed areas with smooth surfaces.

2. The touch screen of claim 1, wherein the first touch electrodes are touch sensing electrodes, and the second touch electrodes are touch driving electrodes.

3. The touch screen of claim 2, wherein the touch screen further comprises a first insulating layer between the first substrate and the first touch electrodes, and wherein uneven areas are provided on one side of the first insulating layer facing the first touch electrodes at regions corresponding to each of the first touch electrodes, and the first touch electrodes are disposed on the first insulating layer according to its shape, forming uneven areas of the first touch electrodes.

4. The touch screen of claim 3, wherein uneven areas on the first insulating layer are one or more recessed areas with smooth surfaces.

5. The touch screen of claim 4, wherein the recessed areas are groove shaped areas extending in the first direction.

6. The touch screen of claim 5, wherein the groove shaped areas have trapezoid shaped longitudinal section along the second direction, and the first touch electrodes have trapezoid shaped longitudinal section.

7. The touch screen of claim 4, wherein the recessed areas are a plurality of hole shaped areas distributed along the first direction.

8. The touch screen of claim 5, wherein the groove shaped areas have isosceles trapezoid shaped longitudinal section along the second direction, and the first touch electrodes have isosceles trapezoid shaped longitudinal section.

9. The touch screen of claim 1, wherein the recessed areas are groove shaped areas extending in the first direction.

10. The touch screen of claim 9, wherein the groove shaped areas have trapezoid longitudinal section along the second direction, and the first touch electrodes have trapezoid shaped longitudinal section.

11. The touch screen of claim 9, wherein the groove shaped areas have isosceles trapezoid shaped longitudinal section along the second direction, and the first touch electrodes have isosceles trapezoid shaped longitudinal section.

12. The touch screen of claim 1, wherein the recessed areas are a plurality of hole shaped areas distributed along the first direction.

13. The touch screen of claim 12, wherein gaps between any two adjacent hole shaped areas among the plurality of hole shaped areas are equal.

14. The touch screen of claim 1, wherein the second touch electrodes are located on and insulated from the first touch electrodes so that a side of the first insulating layer having recessed areas faces the second touch electrodes.

15. The touch screen of claim 1, wherein a color resin layer between the first substrate and the first insulating layer is provided on the first substrate; and the touch screen further comprises a second substrate disposed oppositely to one side of the first substrate having the first touch electrodes; a plurality of sub-pixel units arranged in matrix corresponding to the color resin layer are provided on one side of the second substrate close to the first substrate, and the second touch electrodes are disposed over the sub-pixel units.

16. The touch screen of claim 15, further comprising a black matrix located between the color resin layer and the first substrate, wherein the black matrix corresponds to non-display areas between the adjacent rows and adjacent columns of pixel units, and the first touch electrodes are disposed in regions corresponding to the black matrix.

17. The touch screen of claim 1, wherein the first insulating layer is a silicon oxide layer, a silicon nitride layer or an organic resin layer.

18. A display device comprising the touch screen of claim 1.

* * * * *